United States Patent
Hashimoto

(10) Patent No.: US 9,356,429 B2
(45) Date of Patent: May 31, 2016

(54) QUANTUM CASCADE LASER

(71) Applicant: SUMITOMO ELECTRIC INDUSTRIES, LTD., Osaka-shi, Osaka (JP)

(72) Inventor: Jun-ichi Hashimoto, Chigasaki (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 14/194,054

(22) Filed: Feb. 28, 2014

(65) Prior Publication Data

US 2014/0247851 A1    Sep. 4, 2014

(30) Foreign Application Priority Data

Mar. 4, 2013    (JP) ................................ 2013-041628

(51) Int. Cl.
*H01S 5/00* (2006.01)
*H01S 5/22* (2006.01)
*H01S 5/34* (2006.01)
*B82Y 20/00* (2011.01)
*H01S 5/042* (2006.01)
*H01S 5/02* (2006.01)

(52) U.S. Cl.
CPC . *H01S 5/22* (2013.01); *B82Y 20/00* (2013.01); *H01S 5/3402* (2013.01); *H01S 5/0208* (2013.01); *H01S 5/0422* (2013.01); *H01S 5/0425* (2013.01); *H01S 5/2224* (2013.01); *H01S 2301/176* (2013.01)

(58) Field of Classification Search
CPC ................ H01S 5/227–5/2277; H01S 5/3401; H01S 5/3402
See application file for complete search history.

(56) References Cited

U.S. PATENT DOCUMENTS 5,138,626 A * 8/1992 Yap .......................... 372/46.016
5,703,898 A * 12/1997 Ogura ................. H01S 5/18305
                                                                372/45.01

(Continued)

OTHER PUBLICATIONS

Ballman et al. Double Doped Low Etch Pit Density InP With Reduced Optical Absorption, Journal of Crystal Growth, vol. 62, pp. 198-202, 1983.

(Continued)

*Primary Examiner* — Jessica Stultz
*Assistant Examiner* — Sean Hagan
(74) *Attorney, Agent, or Firm* — Smith, Gambrell & Russell, LLP.

(57) ABSTRACT

A quantum cascade laser includes a substrate having first, second, third, and fourth regions; a stacked semiconductor layer including n-type lower and upper conductive layers, a core layer having a mesa structure, and a cladding layer; first and second buried layers disposed on side surfaces of the core layer and above the substrate; a first electrode disposed on the upper conductive layer above the first region; and a second electrode disposed on the lower conductive layer above the fourth region. The core layer is disposed on the lower conductive layer above the second region. The upper conductive layer is disposed on the first buried layer and the core layer. The cladding layer is disposed on the upper conductive layer above the second region. The substrate and the cladding layer are formed of an undoped or semi-insulating semiconductor. The first and second buried layers are formed of a semi-insulating semiconductor.

19 Claims, 9 Drawing Sheets

(56) References Cited

U.S. PATENT DOCUMENTS

| | | | |
|---|---|---|---|
| 5,960,020 A * | 9/1999 | Nagai | 372/46.016 |
| 5,974,069 A * | 10/1999 | Tanaka et al. | 372/46.01 |
| 6,493,368 B1 * | 12/2002 | Chirovsky et al. | 372/46.01 |
| 6,977,953 B2 * | 12/2005 | Hata et al. | 372/46.01 |
| 2002/0051615 A1 * | 5/2002 | Walpole et al. | 385/131 |
| 2007/0008999 A1 * | 1/2007 | Breznay et al. | 372/45.01 |
| 2008/0219312 A1 * | 9/2008 | Sugiyama et al. | 372/46.01 |
| 2011/0121337 A1 * | 5/2011 | Shakuda | 257/98 |

OTHER PUBLICATIONS

Qi Jie Wang, et al. "High Performance Quantum Cascade Lasers Based on Three-Phonon-Resonance Design", Applied physics Letters, vol. 94, 011103, 4 pages, 2009.

* cited by examiner

QUANTUM CASCADE LASER

BACKGROUND OF THE INVENTION

1. Field of the Invention

The present invention relates to a quantum cascade laser (QCL).

2. Description of the Related Art

QCLs are known as semiconductor optical devices which emit light in a mid-infrared wavelength region. The QCLs are promising light sources usable in fields of environmental gas analysis, medical diagnosis, industrial machining, and the like. A QCL having a buried-heterostructure (BH) is described in Applied physics Letters, vol. 94, 011103, (2009).

This buried-heterostructure-type quantum cascade laser (BH-type QCL) includes a mesa waveguide formed on the substrate, a buried layer formed on a side surface of the mesa waveguide, an upper electrode disposed on the mesa waveguide, and a lower electrode disposed on the back surface of a substrate. The mesa waveguide includes a contact layer, an upper conductive layer, a core layer, and a lower conductive layer. The buried layer is made of a semi-insulating semiconductor, for example. The core layer has a multi-quantum well (MQW) structure. A plurality of subband levels are formed in the conduction band of the MQW structure in the QCL. In this QCL, an electron transfer pathway constructed from a plurality of subband levels in the conduction band is formed in the core layer by applying a predetermined voltage to the core layer through the upper electrode and the lower electrode. Lasing occurs by transfer of electrons through this transfer pathway from a subband level in the high potential side to a subband level in the low potential side while radiative transition is repeated.

SUMMARY OF THE INVENTION

In such a QCL, semiconductor layers disposed on and under the core layer are formed of n-type semiconductor layers because light is emitted by only the transition of electrons between the upper and lower subband levels in the conduction band. However, when the semiconductor is doped with an n-type impurity, free electrons are generated. As a result, an optical absorption loss in QCL is increased due to the effect of the free carrier absorption. In particular, strong optical absorption occurs in the semiconductor highly doped with the n-type impurity for light in the mid-infrared wavelength region. Consequently, the waveguide loss of the light increases due to the optical absorption in the semiconductor layer highly doped with the n-type impurity. For example, in Applied physics Letters, vol. 94, 011103, (2009), a large waveguide loss of 8.77 ($cm^{-1}$) has been reported. An increase in waveguide loss causes an increase of a threshold current and a decrease of efficiency of light emission.

A quantum cascade laser according to an aspect of the present invention includes (a) a substrate having a principal surface, the substrate having a first region, a second region, a third region, and a fourth region which are arranged sequentially along a first direction orthogonal to an axis of the normal to the principal surface; (b) a stacked semiconductor layer disposed on the principal surface of the substrate, the stacked semiconductor layer including an n-type lower conductive layer, a core layer having a mesa structure, an n-type upper conductive layer, and a cladding layer; (c) a first buried layer disposed on one side surface of the core layer and above the first region; (d) a second buried layer disposed on the other side surface of the core layer and above the third region; (e) a first electrode disposed on the upper conductive layer above the first region; and (f) a second electrode disposed on the lower conductive layer above the fourth region. The lower conductive layer is disposed on the second region, the third region, and the fourth region. The core layer is disposed on the lower conductive layer above the second region. The upper conductive layer is disposed on the first buried layer and the core layer. The cladding layer is disposed on the upper conductive layer above the second region. In addition, the substrate and the cladding layer are formed of an undoped or semi-insulating semiconductor, and the first buried layer and the second buried layer are formed of a semi-insulating semiconductor.

In the quantum cascade laser, the core layer is disposed between the upper conductive layer and the lower conductive layer. The first electrode is disposed on the upper conductive layer, and the second electrode is disposed on the lower conductive layer. The upper conductive layer and the lower conductive layer have the same conductivity of n-type. Consequently, a voltage is applied to the core layer through the upper conductive layer and the lower conductive layer. Current is also injected into the core layer through the upper conductive layer and the lower conductive layer. The substrate and the cladding layer are formed of an undoped semiconductor or a semi-insulating semiconductor. Therefore, the optical absorption of the substrate and the cladding layer is small in the mid-infrared wavelength region. As a result, the waveguide loss resulting from the optical absorption of the n-type semiconductor layer is reduced.

In the quantum cascade laser according to the aspect of the present invention, the cladding layer preferably has a length larger than the length of the core layer along the first direction. In this case, the distance between the upper electrode and the core layer is ensured to a predetermined extent or more, and expansion of distribution of the guided light into the upper electrode is suppressed. Consequently, an increase in waveguide loss due to the optical absorption at the upper electrode is reduced.

The quantum cascade laser according to the aspect of the present invention may further include an insulating layer disposed on the stacked semiconductor layer. The insulating layer preferably has a first opening portion disposed above the first region and a second opening portion disposed above the fourth region. The first electrode is in contact with the upper conductive layer through the first opening portion. The second electrode is in contact with the lower conductive layer through the second opening portion. In the quantum cascade laser, the insulating layer is disposed on the stacked semiconductor layer. In this case, the insulating layer has the first opening portion disposed above the first region and the second opening portion disposed above the fourth region. Accordingly, when a voltage is applied between the first and second electrodes, electrons serving as carriers are injected into the core layer through the upper and lower conductive layers that are in contact with the first and second electrodes through the first and second opening portions, respectively.

In the quantum cascade laser according to the aspect of the present invention, the insulating layer is preferably made of any one of silicon oxides, silicon nitrides, silicon oxynitrides, and aluminum oxides. The insulating layer made of a dielectric film such as silicon oxides, silicon nitrides, silicon oxynitrides, and aluminum oxides is used as a protective film for preventing oxidation of the surface of the stacked semiconductor layer. In addition, the insulating layer made of the dielectric film is easily formed by using a sputtering method or a chemical vapor deposition (CVD) method.

In the quantum cascade laser according to the aspect of the present invention, the first electrode may be extended to an area above the second region and the third region. The heat dissipation performance from the core layer is improved by disposing the first electrode not only above the first region but also above the second region and the third region. As a result, the temperature characteristics of the quantum cascade laser are improved.

In the quantum cascade laser according to the aspect of the present invention, preferably, the stacked semiconductor layer on the first region includes the n-type lower conductive layer, the first buried layer, the n-type upper conductive layer, and the cladding layer. The stacked semiconductor layer on the fourth region includes the n-type lower conductive layer, the second buried layer, the n-type upper conductive layer, and the cladding layer. In addition, the stacked semiconductor layers on the first region and the fourth region have a height substantially equal to a height of the stacked semiconductor layer on the second region. When this quantum cascade laser is mounted in the epi-down arrangement, the quantum cascade laser is supported by the stacked semiconductor layer on the first region, the stacked semiconductor layer on the second region, and the stacked semiconductor layer on the fourth region. Consequently, a load is applied to the stacked semiconductor layer on the first region, the stacked semiconductor layer on the second region, and the stacked semiconductor layer on the fourth region, so that the pressure is dispersed. As a result, a physical damage to the mesa waveguide region including the core layer is reduced and degradation in device characteristics is reduced.

In the quantum cascade laser according to the aspect of the present invention, the cladding layer may be formed of a semiconductor containing any one of transition metals of Fe, Ti, Cr, and Co. The semiconductor is allowed to have a semi-insulating property by adding these transition metals as impurities (dopants) to the semiconductor. The semi-insulating semiconductor has a high resistivity with respect to electrons. Consequently, a leak current passing through the cladding layer is reduced and free carriers resulting from electrons injected into the cladding layer is also reduced. As a result, a waveguide loss due to optical absorption related to the free carriers is reduced.

In the quantum cascade laser according to the aspect of the present invention, the first buried layer and the second buried layer may be made of InP containing any one of transition metals of Fe, Ti, Cr, and Co or AlInAs containing the transition metal. Addition of these transition metals as impurities to InP or AlInAs allows InP or AlInAs to have a semi-insulating property. The semi-insulating InP or AlInAs has a high resistivity with respect to electrons, so that a leak current passing through the first buried layer and the second buried layer is suppressed. As a result, the current is confined into the core layer, so that the lasing characteristics of the quantum cascade laser is improved.

In the quantum cascade laser according to the aspect of the present invention, the lower conductive layer, the upper conductive layer, and the cladding layer may be made of InP. The heat dissipation performance from the core layer is improved by using InP for the lower conductive layer, the upper conductive layer, and the cladding layer because InP has high thermal conductivity. As a result, the temperature characteristics of the quantum cascade laser are improved.

In the quantum cascade laser according to the aspect of the present invention, preferably, the core layer includes a plurality of light-emitting layers serving as light-emitting regions and a plurality of injection layers to inject carriers into the light-emitting layers. The light-emitting layers and the injection layers are arranged alternately. When the injection layer is disposed between the light-emitting layers, electrons transfer to the adjacent light-emitting layer continuously and smoothly so that light emission due to the intersubband transition in the conduction band occurs efficiently. As a result, the lasing characteristics of the quantum cascade laser are improved.

In the quantum cascade laser according to the aspect of the present invention, each of the light-emitting layers and the injection layers may be configured to have a super-lattice structure of GaInAs and AlInAs. According to this super-lattice structure, light emission in the mid-infrared wavelength region due to the intersubband transition in the conduction band of the light-emitting layer is obtained.

In the quantum cascade laser according to the aspect of the present invention, the substrate may be made of InP. The lattice constant of the stacked semiconductor layer is close to or matched to the lattice constant of InP. Consequently, the stacked semiconductor layer is epitaxially grown on the InP substrate.

DESCRIPTION OF THE PREFERRED EMBODIMENTS

Figure 1:
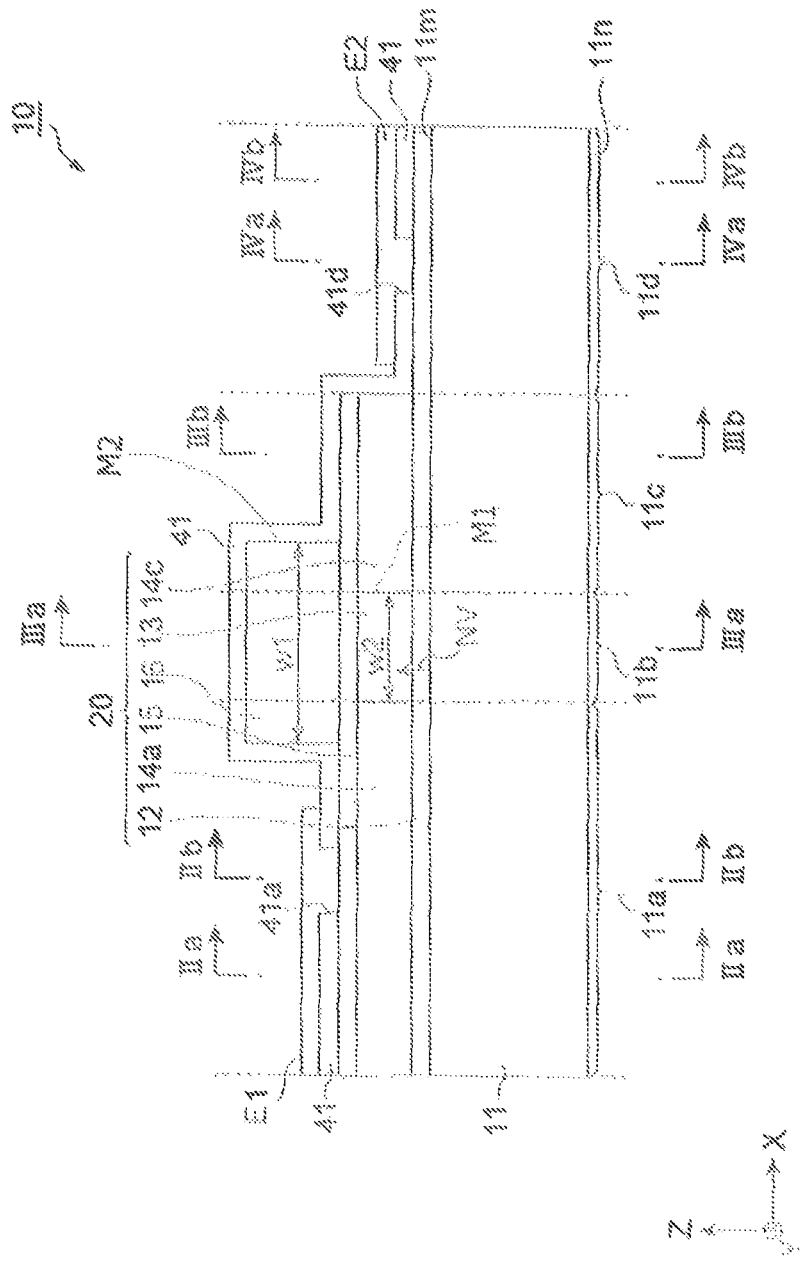
FIG. 1 is a diagram schematically showing the structure of a quantum cascade laser (QCL) according to a first embodiment.

The embodiments according to the present invention will be described below in detail with reference to the attached drawings. In explanations of the drawings, the same or equivalent elements are indicated by the same reference numerals and explanations thereof are not repeated.

First Embodiment

Figure 2A:
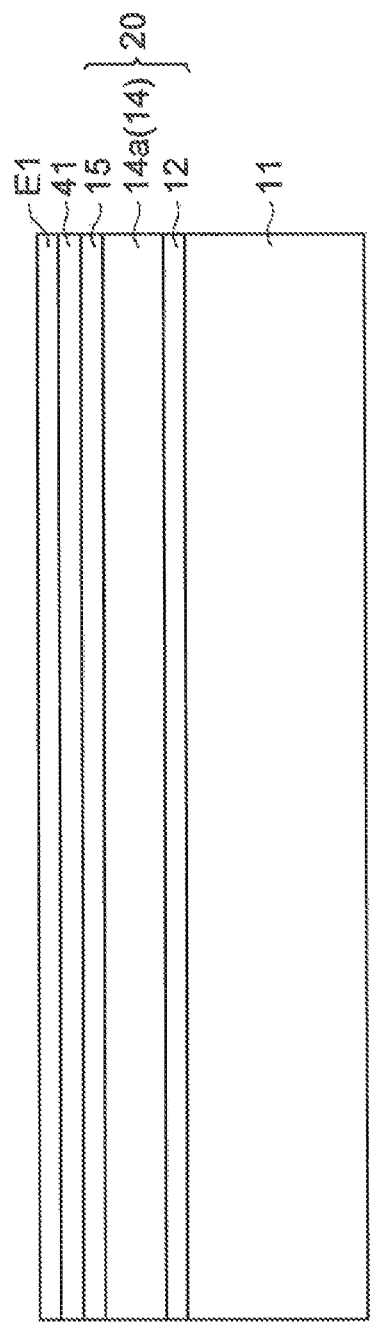
FIG. 2A is a diagram schematically showing a cross-section taken along a line IIa-IIa of the QCL shown in FIG. 1.
Figure 2B:
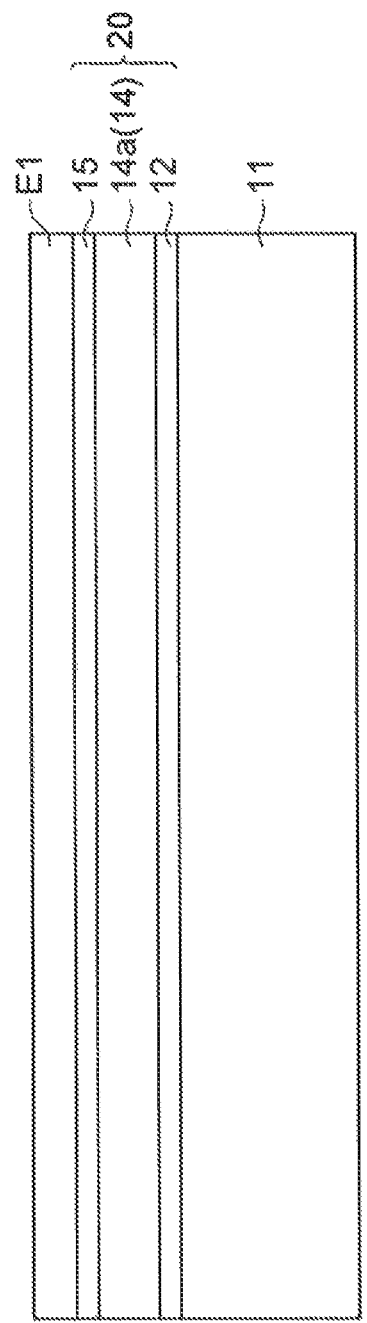
FIG. 2B is a diagram schematically showing a cross-section taken along a line IIb-IIb of the QCL shown in FIG. 1.
Figure 3A:
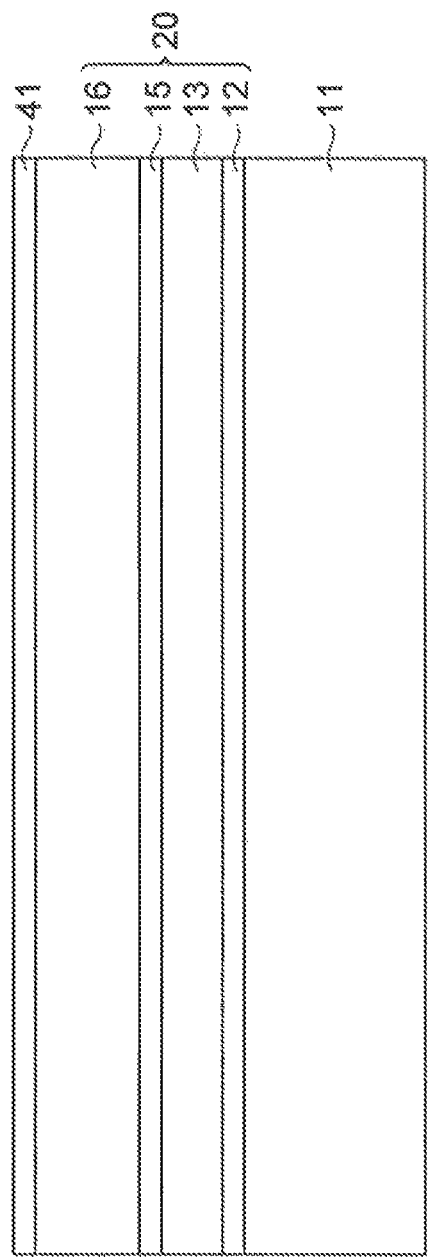
FIG. 3A is a diagram schematically showing a cross-section taken along a line IIIa-IIIa of the QCL, shown in FIG. 1.
Figure 3B:
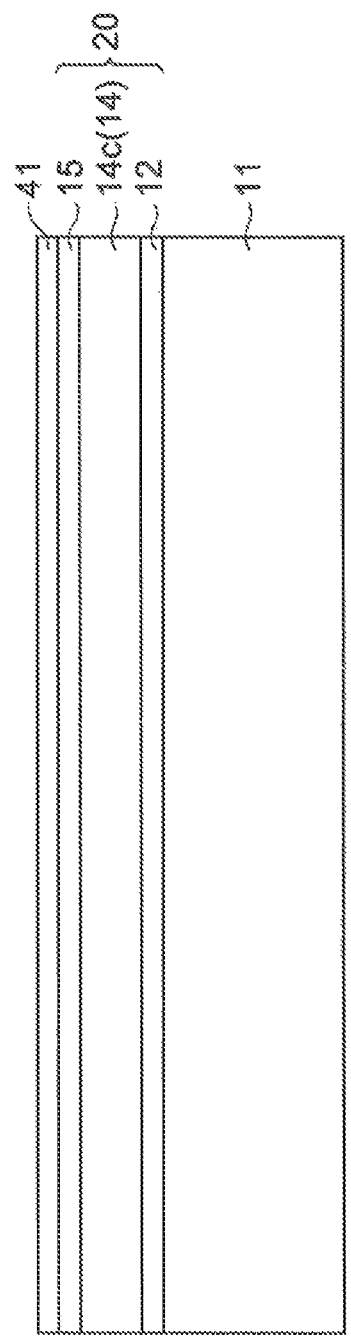
FIG. 3B is a diagram schematically showing a cross-section taken along a line IIIb-IIIb of the QCL shown in FIG. 1.
Figure 4A:
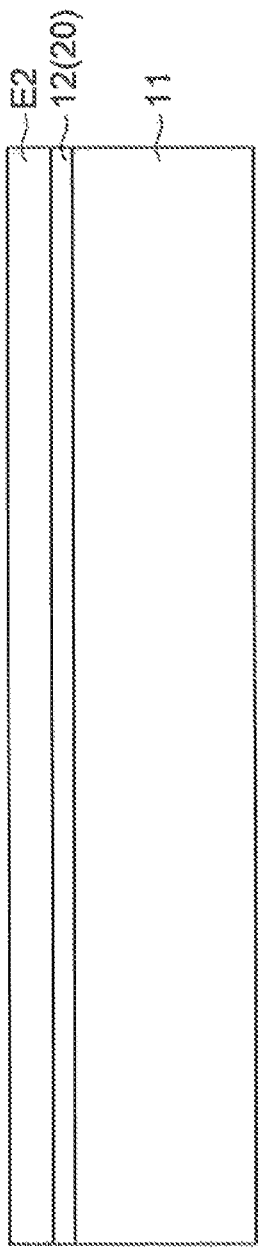
FIG. 4A is a diagram schematically showing a cross-section taken along a line IVa-IVa of the QCL shown in FIG. 1.
Figure 4A:
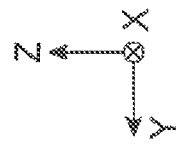
Figure 4B:
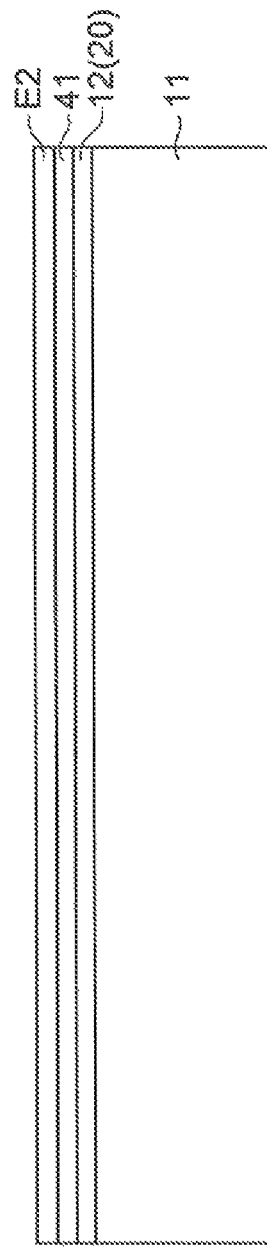
FIG. 4B is a diagram schematically showing a cross-section taken along a line IVb-IVb of the QCL shown in FIG. 1.
Figure 4B:
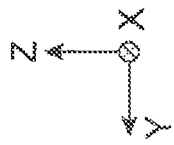
Figure 5:
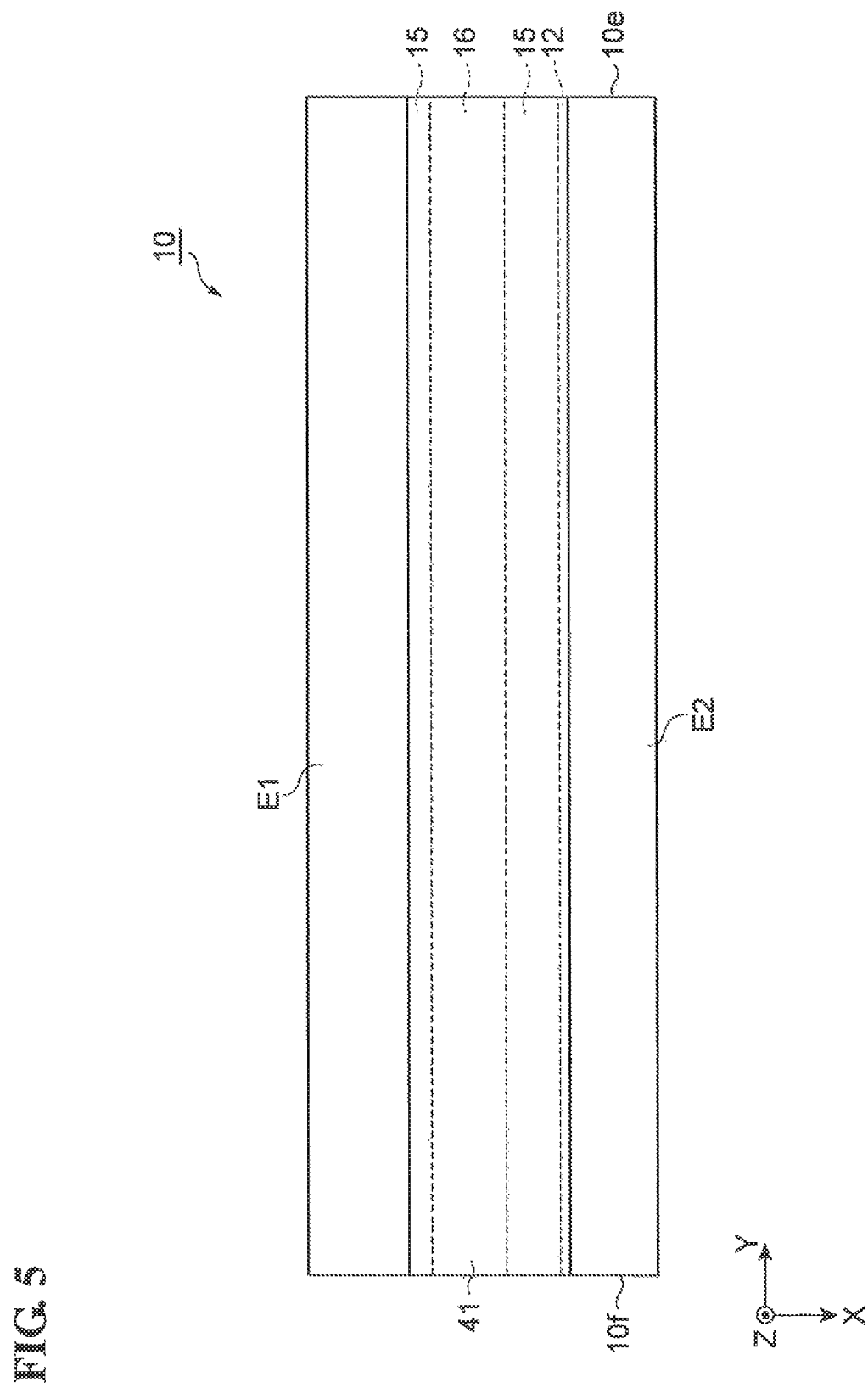
FIG. 5 is a schematic plan view of the QCL shown in FIG. 1.

FIG. 1 is a diagram schematically showing the structure of a quantum cascade laser (QCL) according to a first embodiment. FIG. 2A is a diagram schematically showing a cross-section taken along a line IIa-IIa of the QCL shown in FIG. 1. FIG. 2B is a diagram schematically showing a cross-section taken along a line IIb-IIb of the QCL shown in FIG. 1. FIG. 3A is a diagram schematically showing a cross-section taken along a line IIIa-IIIa of the QCL shown in FIG. 1. FIG. 3B is a diagram schematically showing a cross-section taken along a line of the QCL shown in FIG. 1. FIG. 4A is a diagram schematically showing a cross-section taken along a line IVa-IVa of the QCL shown in FIG. 1. FIG. 4B is a diagram schematically showing a cross-section taken along a line IVb-IVb of the QCL shown in FIG. 1. FIG. 5 is a schematic plan view of the QCL shown in FIG. 1.

As shown in FIG. 1 to FIG. 5, a Quantum Cascade Laser (QCL) 10 has a buried-heterostructure (BH) in which a mesa-shaped core layer is buried with a buried layer serving as a current blocking structure. The QCL 10 emits a light in a mid-infrared wavelength region of about 3 to 20 μm. The QCL 10 includes a substrate 11, a stacked semiconductor layer 20 formed on the substrate 11, an insulating layer 41, an upper electrode E1 (first electrode), and a lower electrode E2 (second electrode). As shown in FIG. 5, the QCL 10 has one end facet 10f and the other end facet 10e opposite to the end facet 10f.

The substrate 11 is made of, for example, undoped InP. The substrate 11 may be a semi-insulating semiconductor substrate. The semi-insulating semiconductor substrate may be made of, for example, semi-insulating InP doped with a transition metal such as Fe, Ti, Cr, and Co. When a semiconductor is doped with these transition metals used as impurities, a deep level to trap electrons is formed in a forbidden band of the semiconductor. The substrate 11 doped with these transition metals has a high resistivity of, for example, $10^5$ Ωcm or more. As for the impurity, Fe is used in general. The optical absorption of the substrate 11 in the mid-infrared wavelength region is low. Consequently, the substrate 11 functions as a lower cladding layer having a small optical absorption loss so as to confine light into a core layer. The thickness of the substrate 11 is, for example, about 100 to 200 μm.

The substrate 11 has a principal surface 11m and a back surface 11n on the side opposite to the principal surface 11m. In addition, the substrate 11 has a first region 11a, a second region 11b, a third region 11c, and a fourth region 11d, which are arranged sequentially along a first direction orthogonal to an axis NV of the normal to the principal surface 11m (hereafter referred to as "width direction"). Each of the first region 11a, the second region 11b, the third region 11c, and the fourth region 11d is extended in the shape of a stripe along a second direction orthogonal to a plane defined by the axis NV of the normal to the principal surface 11m and the width direction.

The stacked semiconductor layer 20 is disposed on the principal surface 11m of the substrate 11. The stacked semiconductor layer 20 includes a lower conductive layer 12, a core layer 13, a buried layer 14a (first buried layer), a buried layer 14c (second buried layer), an upper conductive layer 15, and a cladding layer 16. Each layer included in the stacked semiconductor layer 20 is extended in the shape of a stripe along the second direction intersecting with the width direction. The lower conductive layer 12 is disposed on the second region 11b, the third region 11c, and the fourth region 11d of the substrate 11. The lower conductive layer 12 may also be disposed on the first region 11a. The lower conductive layer 12 is made of, for example, InP having an n-type conductivity (hereafter simply referred to as "n-type"), and the thickness thereof is, for example, 0.1 to 2 μm. Examples of retype impurities include Si, S, Sn, and Se. The core layer 13 is a light-emitting layer in the QCL. The core layer 13 has a (first) mesa structure M1 as shown in FIG. 1. The core layer 13 is disposed on the lower conductive layer 12 on the second region 11b of the substrate 11 and is located between the lower conductive layer 12 and the upper conductive layer 15. The core layer 13 is in contact with the upper conductive layer 15 and the lower conductive layer 12. The length W2 of the core layer 13 along the width direction is, for example, about 3 to 20 μm.

Figure 6:
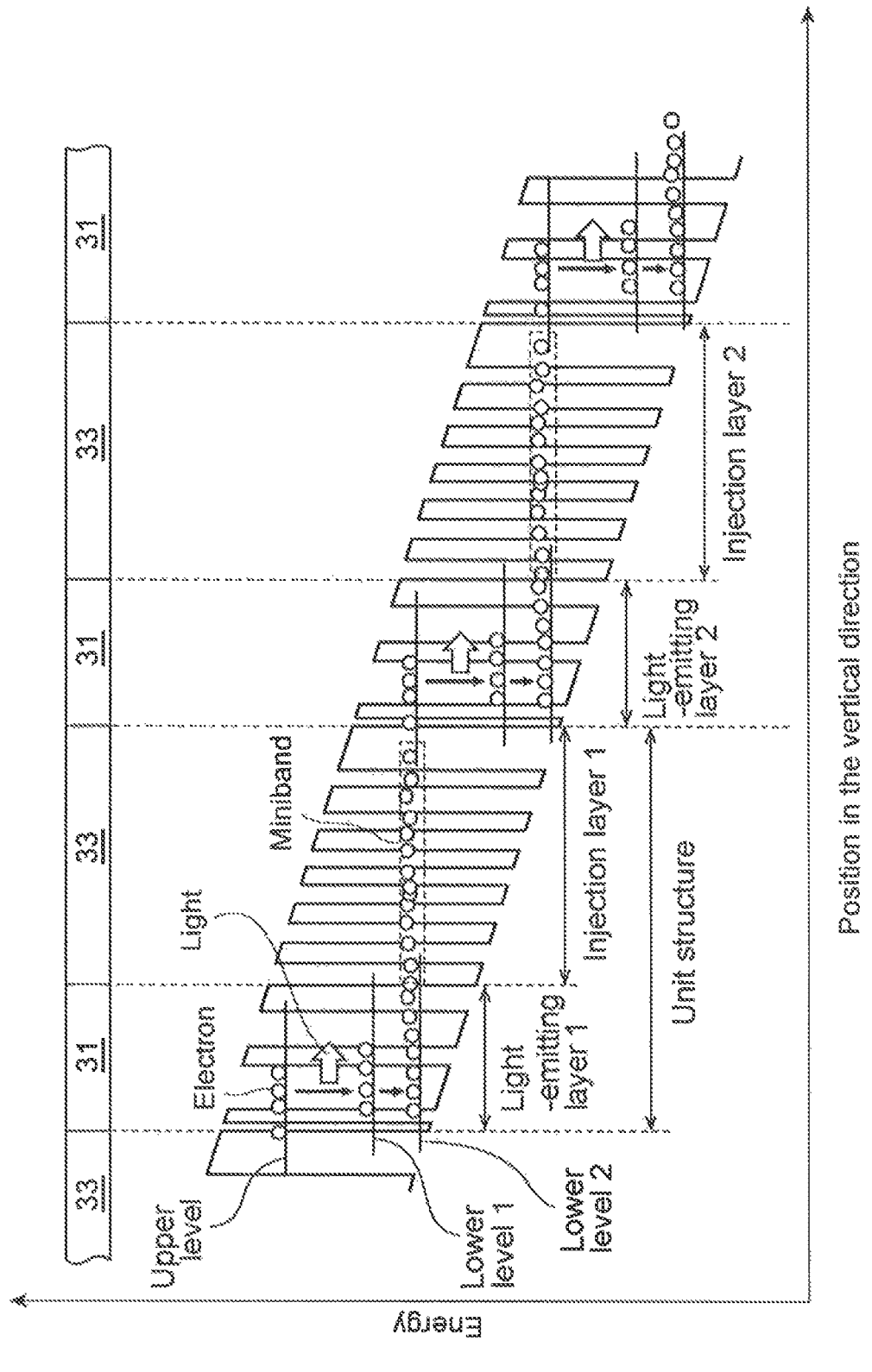
FIG. 6 is a diagram showing an example of a core layer of the QCL shown in FIG. 1.

FIG. 6 is a conduction band diagram showing an example of a core layer 13 of a QCL. In the QCL 10, the core layer 13 includes a plurality of light-emitting layers 31 and a plurality of injection layers 33 to inject carriers into the light-emitting layers 31. In the light-emitting layers 31, light is emitted by a radiative intersubband transition between the upper and lower subbands. The light-emitting layers 31 and the injection layers 33 are arranged alternately. Each of the light-emitting layers 31 and the injection layers 33 has a super-lattice structure of GaInAs/AlInAs.

As shown in FIG. 6, the core layer 13 includes a unit structure composed of the light-emitting layer 31 and the injection layer 33, and the unit structures are connected in multiple steps with several tens of periods. Each of the light-emitting layers 31 and the injection layers 33 has a super-lattice structure in which quantum well layers having a thickness of several nanometers and barrier layers having a thickness of several nanometers are stacked alternately. The barrier layer is formed of a semiconductor layer having bandgap energy larger than the bandgap energy of the quantum well layer.

The light emission principle of the QCL will be described briefly. In the QCL, only electrons are used as carriers, and light emission occurs because of intersubband transition of electrons in the conduction band. As shown in FIG. 6, three subband levels in total, that is, an upper level, a lower level 1, and a lower level 2, are formed in the light-emitting layer having the super-lattice structure. An electric field is applied to this core layer by applying a voltage between the upper electrode E1 and the lower electrode E2. When a predetermined electric field is applied to the core layer, a transfer pathway of electrons constructed by these subband levels is formed in the core layer. In this transfer pathway, electrons are injected by the electric field into an upper level of a light-emitting layer 1 on the high potential side with respect to the electron and make a transition to a lower level 1. At that time, light emission occurs at a wavelength corresponding to the energy difference between the upper level and the lower level 1. The energy difference between the upper level and the lower level 1 is adjusted by appropriately selecting the material compositions and the layer thicknesses of the quantum well layer and the barrier layer constituting the light-emitting layer. In this manner, light emission at a wavelength of 3 to 20 μm in the mid-infrared region is obtained. As for semiconductor materials suitable for light emission in the mid-infrared region, GaInAs is applied to the quantum well layer and AlInAs is applied to the barrier layer in the present embodiment. A QCL capable of lasing at a wavelength of 3 to 20 μm in the mid-infrared region is realized by using these semiconductor materials for the super-lattice structure constituting the core layer.

Subsequently, electrons which have made a transition to the lower level 1 of the light-emitting layer 1 emit longitudinal-optical LO phonons and further relax to the lower level 2 thereunder at a high speed. Thereafter, electrons are injected into an upper level of a light-emitting layer 2 of an adjacent unit structure through an injection layer 1. As is understood from this explanation, the lower level 2 fast relaxes electrons which have made a transition to the lower level 1 and exhausts carriers at the lower level 1. As a result, population inversion of carriers between the upper level and the lower level 1 can be formed efficiently. The injection layer has a structure in which an electron transportation route called mini-band and crowded with a plurality of subband levels is formed, as shown in FIG. 6. Electrons pass through this electron transportation route and are injected into the following light-emitting layer smoothly. The electrons injected into the light-emitting layer 2 make a transition with light emission, as with the light-emitting layer 1, and subsequently, transfer to a light-emitting layer 3 of the next unit structure through an injection layer 2. The same goes thereafter, so that light emission and electron transition are repeated in each of unit structures connected in multiple steps. The output light of the QCL is emitted as sum of the light emissions in the individual unit structures. The optical gain for this light emission increases as the injected current increases. When the injected current reaches a threshold current, the optical gain becomes larger than an optical loss such as an internal loss and a mirror loss, so that lasing occurs.

As described above, the structure in which the injection layers and the light-emitting layers are connected in multiple steps is used for the core layer. In this structure, when the injection layer connects between the light-emitting layers, electrons transfer to the adjacent light-emitting layer continuously and smoothly, and light emission due to the intersubband transition in the conduction band occurs efficiently. In the QCL, only electrons in the conduction band are used for the radiative transition. Light emission occurs due to the intersubband transition of electrons in the conduction band.

On the other hand, the conventional semiconductor laser which is used for optical communications has a p-n junction. In the conventional semiconductor laser, electrons in the conduction band make an interband transition to a valence band and recombine with holes in the valence band. When the electrons recombine with the holes, light with a wavelength corresponding to the transition energy is emitted. Therefore, the QCL emits light on the principle different from the principle of the conventional semiconductor laser having the p-n junction.

The explanation of the QCL 10 will be continued with reference to FIG. 1 to FIG. 5. The buried layer 14a is disposed above the first region 11a of the substrate 11 in such a way as to bury one side surface of the core layer 13. The buried layer 14a is located between the lower conductive layer 12 and the upper conductive layer 15. The buried layer 14c is disposed above the third region 11c of the substrate 11 in such a way as to bury the other side surface of the core layer 13. The buried layer 14c is also located between the lower conductive layer 12 and the upper conductive layer 15. The buried layer 14a and the buried layer 14c are oppositely disposed with the core layer 13 therebetween in the width direction. The thicknesses of the buried layer 14a and the buried layer 14c are nearly equal to the thickness of the core layer 13 and are, for example, 1 to 3 μm.

The buried layer 14a and the buried layer 14e are formed of a semi-insulating semiconductor. The semi-insulating semiconductor used for the buried layer 14a and the buried layer 14c is made of InP, AlInAs, or the like doped with a transition metal such as Fe, Ti, Cr, or Co. The transition metal used as an impurity allows a semiconductor to have a semi-insulating property by forming a deep level to trap electrons in a forbidden band of the semiconductor. The semiconductor doped with these transition metals has a high resistivity of, for example, $10^5$ Ωcm or more with respect to an electron. The buried layer 14a and the buried layer 14c have high resistance for electrons serving as carriers. Therefore, the buried layer 14a and the buried layer 14c function as current blocking layers to confine the current (carriers) in a mesa waveguide region. As for the impurity, Fe is used in general. The optical absorption of the buried layer 14a and the buried layer 14c is low in the mid-infrared wavelength region. Consequently, the buried layer 14a and the buried layer 14c constitute an optical waveguide having a small optical absorption loss, and confine light in the core layer 13 in a transverse direction.

The upper conductive layer 15 is disposed on the buried layer 14a above the first region 11a of the substrate 11. The upper conductive layer 15 is also disposed on the core layer 13 above the second region 11b. In addition, the upper conductive layer 15 may be disposed on the buried layer 14c above the third region 11c of the substrate 11. The upper conductive layer 15 is made of, for example, n-type InP and has a thickness of, for example, 0.1 to 2 μm. For example, Si, S, Sn, or Se is used as the n-type impurity.

The cladding layer 16 has a (second) mesa structure M2 disposed on the upper conductive layer 15 above the second region 11b of the substrate 11. That is, the cladding layer 16 covers the core layer 13 with the upper conductive layer 15 therebetween. Furthermore, the cladding layer 16 covers part of the upper conductive layer 15. Consequently, in the QCL 10, the stacked semiconductor layer 20 is protruded on the second region 11b of the substrate 11. The cladding layer 16 is in contact with the upper conductive layer 15. The refractive index of the cladding layer 16 is smaller than the refractive index of the core layer 13.

The cladding layer 16 is formed of, for example, an undoped semiconductor. For example, InP is used for the undoped semiconductor. The cladding layer 16 may be formed of a semi-insulating semiconductor. For example, the cladding layer 16 may be formed of semi-insulating InP semiconductor containing any one of transition metals of Fe, Ti, Cr, and Co. The transition metal used as an impurity allows a semiconductor to have a semi-insulating property by forming a deep level to trap electrons in a forbidden band. The semiconductor doped with these transition metals has a high resistivity of, for example, $10^5$ Ωcm or more with respect to an electron. As for the impurity, Fe is used in general. The optical absorption of the cladding layer 16 is low in the mid-infrared wavelength region. Consequently, the cladding layer 16 functions as an upper cladding layer having a small optical absorption loss so as to confine light in the core layer 13. The substrate 11, the core layer 13, and the cladding layer 16 constitute an optical waveguide. In the case, the substrate 11 and the cladding layer 16 function as the lower cladding layer and the upper cladding layer, respectively. The thickness of the cladding layer 16 is, for example, 3 to 5 μm. The length W1 of the cladding layer 16 along the width direction is larger than the length W2 of the core layer 13 along the width direction. The length W1 of the cladding layer 16 along the width direction is, for example, 10 to 400 μm.

The insulating layer 41 is disposed on the entire surface of the stacked semiconductor layer 20. That is the insulating layer 41 is disposed on a top surface of the upper conductive layer 15 and a top surface and both side surfaces of the cladding layer 16 above the first region 11a, the second region 11b, and the third region 11c of the substrate 11. In addition, the insulating layer 41 is disposed on a top surface of the lower conductive layer 12 exposed above the fourth region 11d of the substrate 11. The insulating layer 41 has an opening portion 41a (first opening portion) disposed above the first region 11a of the substrate 11. The insulating layer 41 has an opening portion 41d (second opening portion) disposed above the fourth region 11d of the substrate 11. The insulating layer 41 is formed of a dielectric film of, for example, silicon oxides (for example, $SiO_2$), silicon nitrides (for example, SiN), silicon oxynitrides (for example, SiON), or aluminum oxides (for example, alumina). These dielectric films are formed by using a sputtering method or a chemical vapor deposition (CVD) method.

The upper electrode E1 and the lower electrode E2 are disposed on the stacked semiconductor layer 20. Specifically, the upper electrode E1 is disposed on the upper conductive layer 15 above the first region 11a of the substrate 11. The upper electrode E1 is in contact with the upper conductive layer 15 through the opening portion 41a of the insulating layer 41. The upper electrode E1 is made of, for example, Ti/Au or Ge/Au. The lower electrode E2 is disposed on the lower conductive layer 12 on the fourth region 11d of the substrate 11. The lower electrode E2 is in contact with the lower conductive layer 12 through the opening portion 41d of the insulating layer 41. The lower electrode E2 is made of, for example, Ti/Au or Ge/Au.

In the QCL 10 having the above-described configuration, the lower conductive layer 12, the core layer 13, the upper conductive layer 15, and the cladding layer 16 are disposed in that order on the second region 11b of the substrate 11, so as to constitute a mesa waveguide region. The buried layer 14a and the buried layer 14c are disposed on both side surfaces of the core layer 13 and on the lower conductive layer 12 above the first region 11a and the third region 11c of the substrate 11. The core layer 13 is buried with the buried layer 14a and the buried layer 14c. The buried layer 14a and the buried layer 14c have high resistance with respect to electrons and, therefore, function as current blocking layers to confine the current in the core layer 13. The lower conductive layer 12 is disposed on the first region 11a, the second region 11b, the third region 11c, and the fourth region 11d of the substrate 11 and is in contact with the lower electrode E2 above the fourth region 11d. The upper conductive layer 15 is disposed above the first region 11a, the second region 11b, and the third region 11e of the substrate 11 and is in contact with the upper electrode E1 above the first region 11a. Consequently, a predetermined electric field is applied to the core layer 13 by applying a voltage between the upper electrode E1 and the lower electrode E2, so that the QCL 10 is allowed to emit light.

A method for manufacturing the QCL 10 will be described. Initially, an undoped or semi-insulating substrate 11 is prepared. Subsequently, an n-type lower conductive layer 12 and a core layer 13 is sequentially grown on the principal surface 11m of the substrate 11 by using a crystal growth method such as an organometallic vapor phase epitaxy (OMVPE) method and a molecular beam epitaxy (MBE) method. A first mask is formed on the core layer 13. The first mask has a pattern to form a mesa waveguide region in the device center above the second region 11b. The core layer is etched by using the first mask to form the mesa waveguide region.

Buried layers are grown on the side surfaces of the core layer 13 and on the lower conductive layer 12 that is exposed by etching while the first mask is left on the core layer 13. The buried layers are made of a semi-insulating semiconductor material such as Fe-doped InP. In this manner, a first buried layer 14a is formed on one side surface of the core layer 13 and the lower conductive layer 12 on the first region 11a. A second buried layer 14c is formed on the other side surface of the core layer 13 and the lower conductive layer 12 on the third region 11c and the fourth region 11d. On the other hand, no buried layer is grown above the second region 11b protected with the first mask. After the first mask is removed, an n-type upper conductive layer 15 and an undoped or semi-insulating cladding layer 16 are grown successively on the first buried layer 14a, the second buried layer 14c and the core layer 13. A second mask is formed on the surface of the cladding layer 16 above the second region 11b. The cladding layer 16 formed above the first region 11a, the third region 11c, and the fourth region 11d is selectively removed by etching using the second mask. A third mask is formed on the surfaces on the n-type upper conductive layer 15 exposed by etching above the first region 11a and the third region 11c. In addition, the third mask is formed on side surfaces and a top surface of the cladding layer 16 above the second region 11b. The second buried layer 14c and the upper conductive layer 15 formed above the fourth region 11d are selectively removed by etching using the third mask.

Thereafter, the second and third mask is removed, and an insulating layer 41 is formed on an entire surface above the first, second, third and fourth regions 11a, 11b, 11c, and 11d by a sputtering method or a CVD method. The second mask may be removed before forming the third mask. A first opening portion 41a and a second opening portion. 41d are formed in predetermined regions above the first region 11a and the fourth region 11d, respectively, by using a photolithography method. An upper electrode E1 is formed on the insulating layer 41 and in the first opening portion 41a by using, for example, a lifts off method. The upper electrode E1 is in contact with the upper conductive layer 15 through the first opening portion 41a. Likewise, a lower electrode E2 is formed on the insulating layer 41 and in the second opening portion 41d. The lower electrode E2 is in contact with the lower conductive layer 12 through the second opening portion 41d. The back surface 11n of the semiconductor substrate 11 is thinned to, for example, about 100 to 200 μm by polishing or the like. Finally, the semiconductor substrate 11 is cleaved and, thereby, the QCL 10 having a predetermined cavity length is produced. The first mask, second mask, third mask and insulating layer 41 are preferably made of a dielectric material of, for example, $SiO_2$, SiN or SiON.

Then, operations and advantages of the QCL 10 will be described. In the QCL in the related art, the n-type semiconductor layers arranged above and under the core layer and the substrate are doped with a high concentration of n-type impurity. Consequently, a voltage is applied to only the core layer efficiently, and current is injected into the core layer efficiently. In the conventional QCL, the n-type substrate has an impurity concentration in the range of about $1 \times 10^{17}$ ($cm^{-3}$) to $5 \times 10^{18}$ ($cm^{-3}$). The n-type lower and upper cladding layers have an impurity concentration in the range of $1 \times 10^{16}$ ($cm^{-3}$) to $1 \times 10^{19}$ ($cm^{-3}$). The n-type contact layer has an impurity concentration in the range of $1 \times 10^{19}$ ($cm^{-3}$) to $1 \times 10^{20}$ ($cm^{-3}$) to obtain good ohmic contact with the upper electrode. However, free electrons are generated by adding n-type impurities to the above-described individual layers, and large optical absorption occurs in these n-type semiconductor layers because of these free electrons. This optical absorption increases in proportion to the square of the wavelength, so that optical absorption increases in the mid-infrared wavelength region as compared with the wavelength region of 1.3 to 1.6 μm. For example, the wavelength dependence of the optical-absorption coefficient for InP doped with an n-type impurity is shown in FIG. 2 in p. 200 of Journal of Crystal Growth, vol. 62, pp. 198-202, (1983). According to this, the absorption coefficient in the wavelength band (1.3 to 1.6 μm band) which is used in the optical communication systems is less than 1 $cm^{-1}$. However, the absorption coefficient of InP doped with the n-type impurity increases sharply in the mid-infrared wavelength region. InP doped with the n-type impurity has a large optical absorption loss in the mid-infrared wavelength region. For example, at the mid-infrared wavelength region of 8 μm, InP doped with the n-type impurity has a large optical absorption loss of 17 $cm^{-1}$ even when InP is doped with the low impurity concentration of $3.3 \times 10^{16}$ ($cm^{-3}$). As described above, the optical loss in the gain medium of the QCL increases because of large optical absorption in the n-type semiconductor layer.

On the other hand, in the QCL 10, a voltage is applied to the core layer 13 through the upper conductive layer 15 in contact with the upper electrode E1 and the lower conductive layer 12 in contact with the lower electrode E2. A current is also injected into the core layer 13 through the upper and lower conductive layers 15 and 12. The upper and lower conductive layers 15 and 12 have the same n-type conductivity for applying a voltage to the core layer 13. On the other hand, the substrate 11 and the cladding layer 16 are not necessarily doped with the n-type impurity. Therefore, the substrate 11 and the cladding layer 16 are formed of an undoped semiconductor or a semi-insulating semiconductor which exhibits low optical absorption in the mid-infrared wavelength region. As a result, the waveguide loss resulting from optical absorption in the n-type semiconductor layer is reduced.

In particular, the thickness of the substrate and the thickness of the cladding layers arranged above and under the core layer are specified to be large to confine the guided light in the core layer. At this time, a large proportion of guided light is also distributed to the substrate and the cladding layers. Therefore, if the substrate and the cladding layers are formed of the n-type semiconductor as with the structure in the conventional QCLs, the guided light passing through the core layer is absorbed by the substrate and the cladding layers and a large waveguide loss occurs in the optical waveguide including the core layer. On the other hand, in the QCL 10, the substrate 11 and the cladding layer 16 are formed of an undoped semiconductor or a semi-insulating semiconductor which exhibits low optical absorption. Consequently, optical absorption losses in the substrate 11 and the cladding layer 16 are reduced. Meanwhile, the lower conductive layer 12 and the upper conductive layer 15 are doped with the n-type impurity. However, the thicknesses of the lower conductive layer 12 and the upper conductive layer 15 are small as compared with the thicknesses of the substrate 11 and the cladding layer 16 and are about 0.1 to 2 µm. Consequently, the proportion of the guided light distributed to the lower conductive layer 12 and the upper conductive layer 15 is small, so that an amount of optical absorption in the lower conductive layer 12 and the upper conductive layer 15 is also small. As described above, in the QCL 10, the optical absorption loss due to the semiconductor containing an n-type impurity can be reduced. Therefore, the waveguide loss in the optical waveguide structure including the substrate 11 (lower cladding layer), the core layer, and the cladding layer 16 (upper cladding layer) can also be reduced.

The undoped semiconductor and the semi-insulating semiconductor have a high resistivity. Therefore, a leak current passing through the substrate 11 and the cladding layer 16 is reduced. In addition, optical absorption due to free carriers resulting from the leak current to the substrate 11 and the cladding layer 16 is suppressed. Therefore, for the QCL 10, the substrate 11 and the cladding layer 16 having a low optical absorption are realized. In addition, the substrate 11 and the cladding layer 16 serve as a lower cladding layer and an upper cladding layer, respectively.

The substrate 11 and the cladding layer 16 may be formed of a semiconductor containing any one of transition metals of Fe, Ti, Cr, and Co. The semiconductor is allowed to have a semi-insulating property by adding these transition metals as impurities to the semiconductor. The semi-insulating semiconductor doped with these transition metals of Fe, Ti, Cr, and Co has a high resistivity with respect to electrons.

The advantages and disadvantages of the undoped semiconductor and the semi-insulating semiconductor will be compared. The semi-insulating semiconductor has a resistivity higher than that of the undoped semiconductor. Therefore, a leak current to the substrate 11 and the cladding layer 16 is further reduced by using the semi-insulating semiconductor for the substrate 11 and the cladding layer 16 as compared with the case where the undoped semiconductor is used. In addition, a semi-insulating semiconductor substrate doped with Fe or the like has a lower defect density as compared with an undoped semiconductor substrate. Therefore, a semiconductor layer grown on the semi-insulating semiconductor substrate doped with Fe or the like has better crystallinity.

On the other hand, when the semi-insulating semiconductor is used for the substrate 11 and the cladding layer 16, inter diffusion between transition metals, e.g., Fe, added to the semi-insulating semiconductor and n-type impurities added to the lower conductive layer 12 and the upper conductive layer 15 is occurred during crystal growth. Resistances of the lower conductive layer 12 and the upper conductive layer 15 are increased due to the inter diffusion of the transition metals, e.g., Fe, to the lower conductive layer 12 and the upper conductive layer 15. As a result, degradation in characteristics, e.g., an increase in device resistance, occurs. On the other hand, when the undoped semiconductor is used for the substrate 11 and the cladding layer 16, such inter diffusion does not occur and, therefore, the above-described degradation in characteristics can be avoided.

The width W1 of the cladding layer 16 is preferably larger than the width W2 of the core layer 13. The guided light is also widely distributed to the outside of the core layer 13 while centering on the core layer 13. Consequently when the width W1 of the cladding layer 16 is smaller than or equal to the width W2 of the core layer 13, the guided light is distributed and is spread to the upper electrode E1 as well. As a result, the waveguide loss is increased by strong optical absorption at the upper electrode E1. In particular, Au serving as an electrode material has a large optical-absorption coefficient in the mid-infrared wavelength region. Therefore, spreading of guided light into the upper electrode E1 causes a large optical absorption loss. On the other hand, when the width W1 of the cladding layer 16 is larger than the width W2 of the core layer 13, a predetermined value or more of distance between the upper electrode E1 and the core layer 13 is ensured. Accordingly, the guided light does not expand to the upper electrode E1. Therefore, an increase in waveguide loss due to spreading of the guided light to the upper electrode E1 is reduced.

The buried layer 14a and the buried layer 14c are made of InP or AlInAs containing any one of transition metals of Fe, Ti, Cr, and Co. Addition of these transition metals as impurities to InP or AlInAs allows InP of AlInAs to have a semi-insulating property. The resulting semi-insulating InP or AlInAs has a high resistivity with respect to electrons. Therefore, a leak current passing through the buried layer 14a and the buried layer 14c is suppressed. As a result, the current is confined in the core layer 13, so that the lasing characteristics of the QCL 10 can be improved.

The buried layer 14a and the buried layer 14c may be formed of a semiconductor material having a larger bandgap energy than those of the core layer 13, the lower conductive layer 12, and the upper conductive layer 15. In this case, discontinuity of energy at conduction band edges between the buried layers 14a and 14c and the core layer 13, between the buried layers 14a and 14c and the lower conductive layer 12, and between the buried layers 14a and 14c and the upper conductive layer 15 increases. Accordingly, energy barriers to electrons which are formed at interfaces between these adjacent layers (core layer 13, lower conductive layer 12, and upper conductive layer 15) and the buried layer 14a and the buried layer 14c further increase. Consequently, injection of electrons (leak of current) from the adjacent layers into the buried layer 14a and the buried layer 14c is further reduced because of high resistivity of the buried layer 14a and the buried layer 14c and, in addition, increased energy barriers. Therefore, the buried layer 14a and the buried layer 14c function as good current blocking layers against electrons, so that the current is further strongly confined in the mesa waveguide region including the core layer 13. As a result, the lasing characteristics of the QCL can be improved.

For example, AlInAs is used as a semiconductor material having a large bandgap energy. AlInAs has a bandgap energy larger than that of InP. Consequently, the energy barriers to electrons can be further increased by using AlInAs for the buried layer 14a and the buried layer 14c as compared with the case where InP is used.

The QCL 10 includes the insulating layer 41 to cover the surface of the stacked semiconductor, layer 20. The surface of the stacked semiconductor layer 20 has a region on which the upper electrode E1 and the lower electrode E2 are not disposed. If this region is exposed to the air, oxygen and moisture in the air adsorb on the surface of the stacked semiconductor layer 20, for example. As a result, the device is degraded because of oxidation of the surface of the stacked semiconductor layer 20. Therefore, the surface of the stacked semiconductor layer 20 is preferably covered with the insulating layer 41. Consequently, the surface of the stacked semiconductor layer 20 is isolated from the air, so that oxidation of the surface of the stacked semiconductor layer 20 is suppressed effectively. As a result, degradation of the device due to oxidation is suppressed and the reliability of the QCL 10 is improved. In this manner, the freedom in structure design can be improved and, in addition, the characteristics and the reliability can be improved by including the insulating layer 41.

The upper electrode E1 is not disposed on the upper surface and the side surface of the cladding layer 16. Consequently, distribution of the guided light to the upper electrode E1 is prevented. Therefore, an increase in waveguide loss due to the optical absorption at the upper electrode E1 is suppressed.

Each semiconductor layer constituting the QCL 10 has a lattice constant which is close to or matched to that of an InP substrate. Accordingly, the stacked semiconductor layer 20 is epitaxially grown on the substrate 11 made of InP. The superlattice structures in the light-emitting layer 31 and the injection layers 33 are composed of a lattice-matched quantum well structure. In addition, the super-lattice structures in the light-emitting layer 31 may be composed of a strained-quantum well structure or a strain compensated quantum well structure. In addition, when the lower conductive layer 12, the upper conductive layer 15, and the cladding layer 16 are made of InP, these semiconductor layers are also lattice-matched to the substrate 11 made of InP. Therefore, the lower conductive layer 12, the upper conductive layer 15, and the cladding layer 16 that are made of InP are epitaxially grown on the substrate 11 made of InP. Furthermore, InP has a large thermal conductivity. Consequently, when the lower conductive layer 12, the upper conductive layer 15, and the cladding layer 16 are made of InP, the heat dissipation performance from the core layer 13 is improved and the temperature characteristics of the QCL 10 is also improved.

In the present embodiment, the core layer 13 has a cascade structure in which a plurality of light-emitting layers and a plurality of injection layers are arranged alternately. Each of the light-emitting layers and the injection layers is configured to have a super-lattice structure of GaInAs and AlInAs. According to this configuration, light emission in the mid-infrared region is obtained because of the intersubband transition in the conduction band of the light-emitting layer. In addition, injection layers are disposed between the light-emitting layers and, thereby, electrons transfer to the adjacent light-emitting layer continuously and smoothly, so that light emission due to the intersubband transition in the conduction band occurs efficiently.

The QCL 10 in the present example and a conventional buried-heterostructure laser diode (BH-LD) including the pn junction region in an active layer will be compared. In the conventional BH-LD formed on an n-type InP substrate, an upper cladding layer formed on the active layer is formed of a p-type semiconductor layer. The buried layer made of a semi-insulating semiconductor such as Fe-doped InP is formed on the side surface of a mesa waveguide region including the p-type upper cladding layer and the active layer. The buried layer is in contact with the p-type upper cladding layer. The semi-insulating semiconductor such as Fe-doped InP cannot trap holes. Therefore, the semi-insulating semiconductor such as Fe-doped InP does not exhibit a high resistivity to holes. Consequently, a hole current is pass through the buried layer easily. Therefore, as for the hole current, a large leak current due to holes is generated outside the mesa waveguide region. As a result, the current cannot be confined in the mesa waveguide region including the active layer, so that good lasing characteristics are not obtained. On the other hand, the QCL is formed of only the n-type semiconductor and only an electron current occurs. Therefore, the leak current issue due to the hole current in the conventional BH-LD does not occur. Then, in the structure of the QCL 10 according to the present embodiment, the current is favorably strongly confined in the mesa waveguide region, so that good lasing characteristics are obtained.

EXAMPLES

The present invention will be more specifically described below with reference to the examples and the comparative examples, although the present invention is not limited to the following examples.

In order to examine advantages of the QCL 10, in the configuration of the QCL 10 shown in FIG. 1, waveguide losses in the regions other than the core layer 13 are calculated for the n-type cladding layer 16 and the n-type the substrate 11 as compared with the cladding layer 16 and the substrate 11 made of a semi-insulating or undoped semiconductor.

Comparative Example 1

As a calculation model for the n-type cladding layer 16 and the n-type substrate 11, the following QCL structure with a lasing wavelength of 7.8 µm is assumed.
Substrate: n-type InP having an impurity concentration of $2 \times 10^{17}$ (cm$^{-3}$)
Lower conductive layer: n-type InP having an impurity concentration of $2 \times 10^{17}$ (cm$^{-3}$), thickness 1 µm
Core layer: configured to have an AlInAs/GaInAs super-lattice structure corresponding to a lasing wavelength of 7.8 µm, thickness 1.4337 µm, width (W2) 10 µm
Upper conductive layer: n-type InP having an impurity concentration of $2 \times 10^{17}$ (cm$^{-3}$), thickness 1 µm
Cladding layer: n-type InP having an impurity concentration of $2 \times 10^{17}$ (cm$^{-3}$), thickness 3.5 µm, width (W1) 30 µm
Buried layer: Fe-doped InP, thickness 1.4337 µm The material for the above-described each layer is specified to be a most common material, and the impurity concentration and the thickness are specified to be typical values. The width W2 of the core layer is specified to be 10 µm that is a typical value in a lasing wavelength band of 7 to 8 µm for the QCL, and the width W1 of the conductive layer is specified to be 30 μm which is a sufficiently large value to the extent that no guided light is distributed on the upper electrode E1.

Example 1

Next, as a calculation model for the cladding layer 16 and the substrate 11 that are made of semi-insulating or undoped InP, the following QCL structure is assumed. Those other than the substrate and the cladding layer are specified to have the same QCL structure as that in Comparative example 1.
Substrate: semi-insulating or undoped InP
Lower conductive layer: n-type InP having an impurity concentration of $2 \times 10^{17}$ ($cm^{-3}$), thickness 1 μm
Core layer: configured to have an AlInAs/GaInAs super-lattice structure corresponding to a lasing wavelength of 7.8 μm, thickness 1.4337 μm, width (W2) 10 μm
Upper conductive layer: n-type InP having an impurity concentration of $2 \times 10^{17}$ ($cm^{-3}$), thickness 1 μm
Cladding layer: semi-insulating or undoped InP, thickness 3.5 μm, width (W1) 30 μm
Buried layer: Fe-doped InP, thickness 1.4337 μm The QCL emits light with a transverse magnetic (TM) mode. Consequently, as for the above-described QCL structure, the guided light distribution in the fundamental TM mode is calculated and the waveguide loss is calculated on the basis of that. The waveguide loss of the QCL structure in Comparative example 1 is about 7.0 $cm^{-1}$. On the other hand. The waveguide loss of the QCL structure in Example 1 is reduced to about 3.9 $cm^{-1}$.

Accordingly, the waveguide loss is reduced, by about 44%, from about 7.0 $cm^{-1}$ to about 3.9 $cm^{-1}$ by employing the constitution in which the substrate and the cladding layer are made of the semi-insulating semiconductor or the undoped semiconductor as compared with the QCL having the n-type substrate and the n-type cladding layer. Consequently, for the QCL 10, the waveguide loss is effectively reduced.

Second Embodiment

Figure 7:
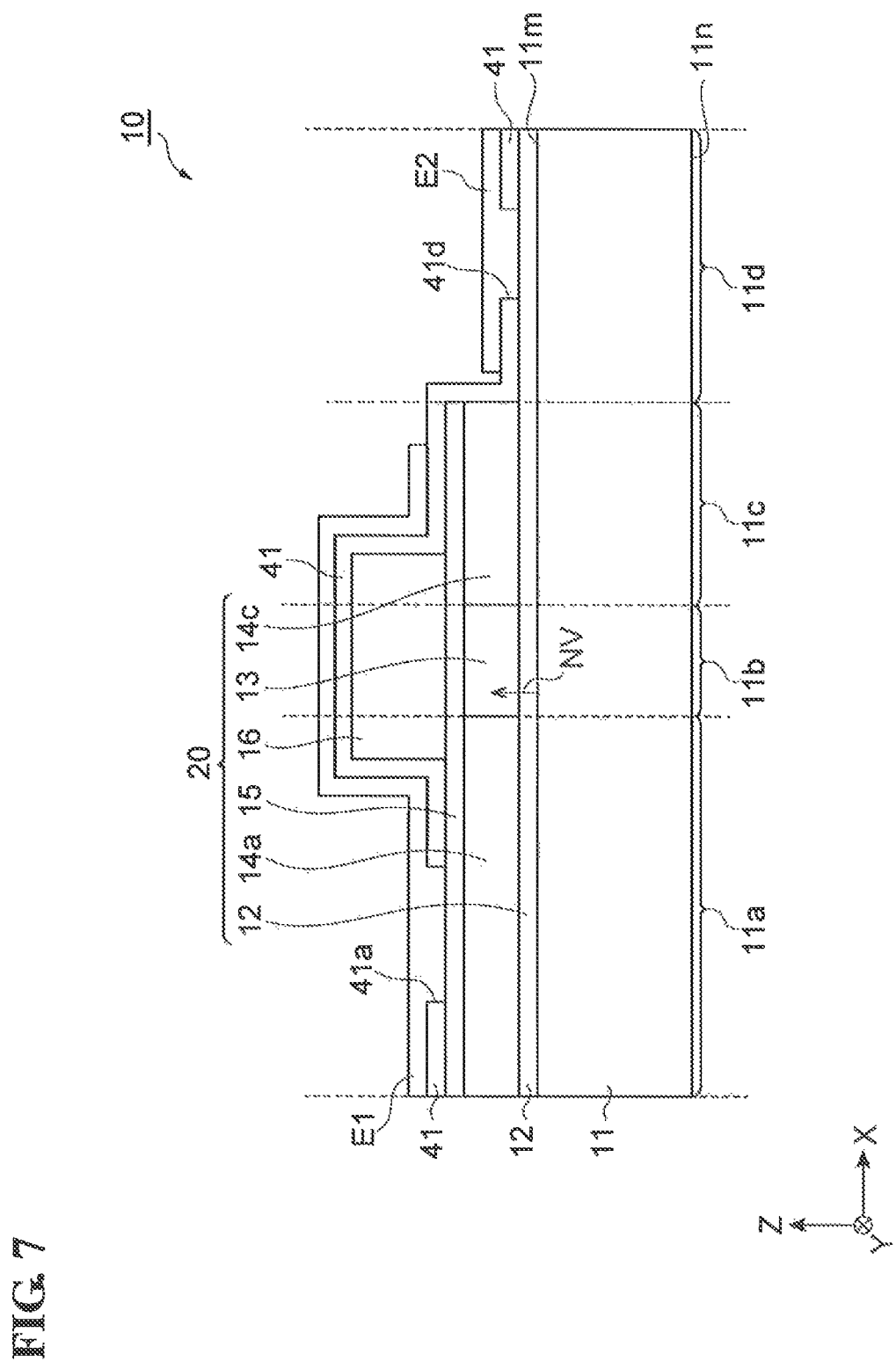
FIG. 7 is a diagram schematically showing the structure of a QCL according to a second embodiment.

FIG. 7 is a diagram schematically showing the structure of a QCL 10 according to a second embodiment. As shown in FIG. 7, the QCL 10 according to the second embodiment is different from the QCL 10 according to the first embodiment in the region on which an upper electrode E1 is disposed. That is, in the QCL 10 according to the second embodiment, the upper electrode E1 is not only disposed above the first region 11a of the substrate 11 but also extended to an area above the second region 11b and the third region 11c. The upper electrode E1 is in contact with the upper conductive layer 15 through the opening portion 41a of the insulating layer 41 above the first region 11a and is insulated from the other semiconductor layers by the insulating layer 41 in the other portion.

The QCL 10 according to the second embodiment exerts the same effects as those of the QCL 10 according to the first embodiment. In the QCL 10 according to the second embodiment, the upper electrode E1 is also disposed above the second region 11b and the third region 11c of the substrate 11. Consequently, the heat dissipation efficiency of the heat generated in the core layer during current injection is improved, and the operation of the QCL 10 is further stabilized. In the QCL 10 according to the second embodiment, the insulating layer 41 is disposed between the cladding layer 16 and the upper electrode E1. Consequently, a leak current through the cladding layer 16 is further reduced as compared with the structure without the insulating layer 41 disposed between the cladding layer 16 and the upper electrode E1. Therefore, free carriers in the cladding layer 16 resulting from the leak current are further reduced. As a result, optical absorption due to free carriers resulting from the leak current in the cladding layer 16 is further suppressed. Consequently, optical absorption in the cladding layer 16 is further reduced during operation of the QCL 10.

Figure 8:
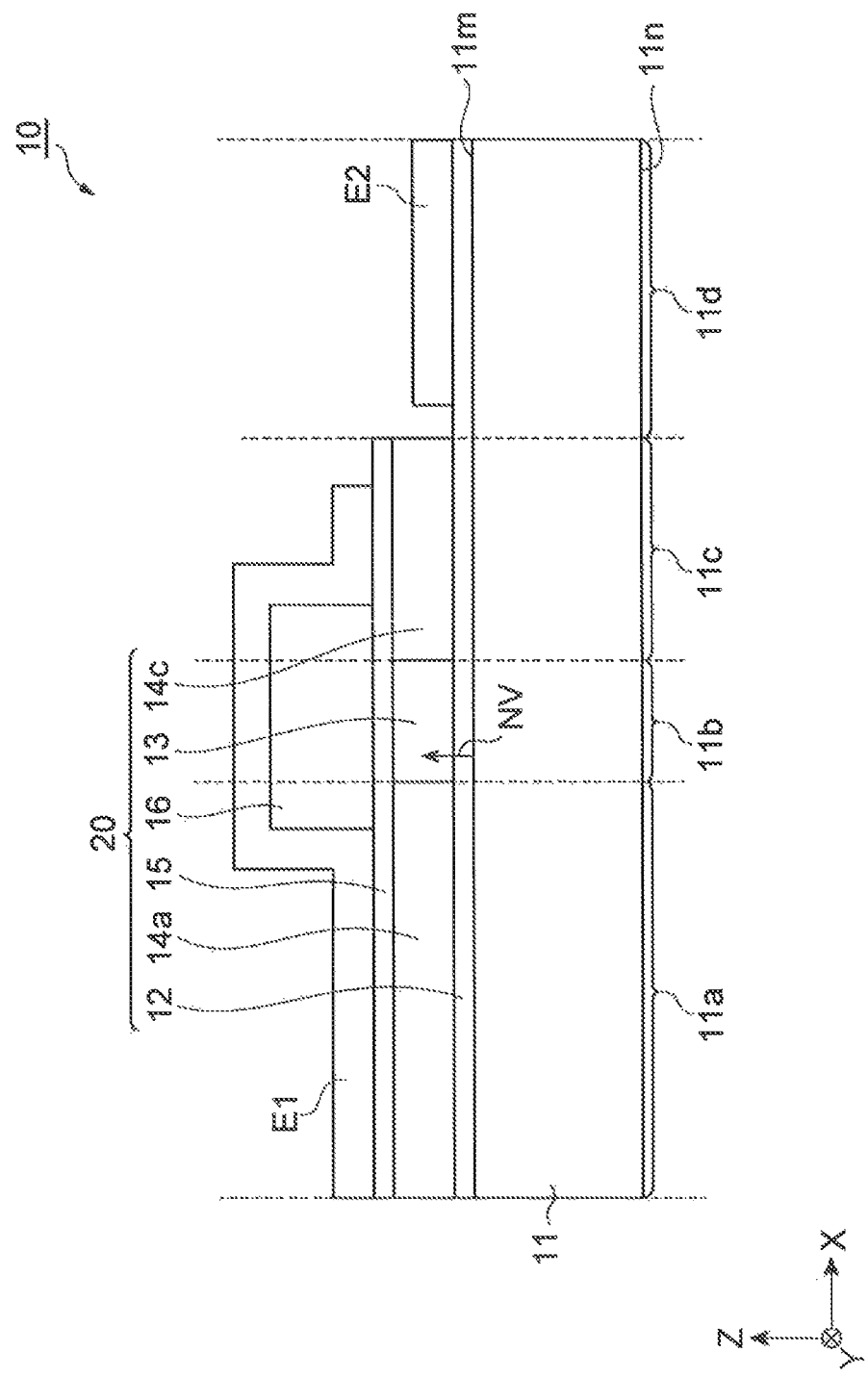
FIG. 8 is a diagram schematically showing the structure of a modified example of the QCL according to the second embodiment.

The cladding layer 16 is formed of an undoped or semi-insulating semiconductor having a high resistivity, so that a leak current through the cladding layer 16 is suppressed. Consequently, as shown in FIG. 8, the QCL 10 is operated without the insulating layer 41. Therefore, the upper electrode E1 may be in contact with the cladding layer 16.

Third Embodiment

Figure 9:
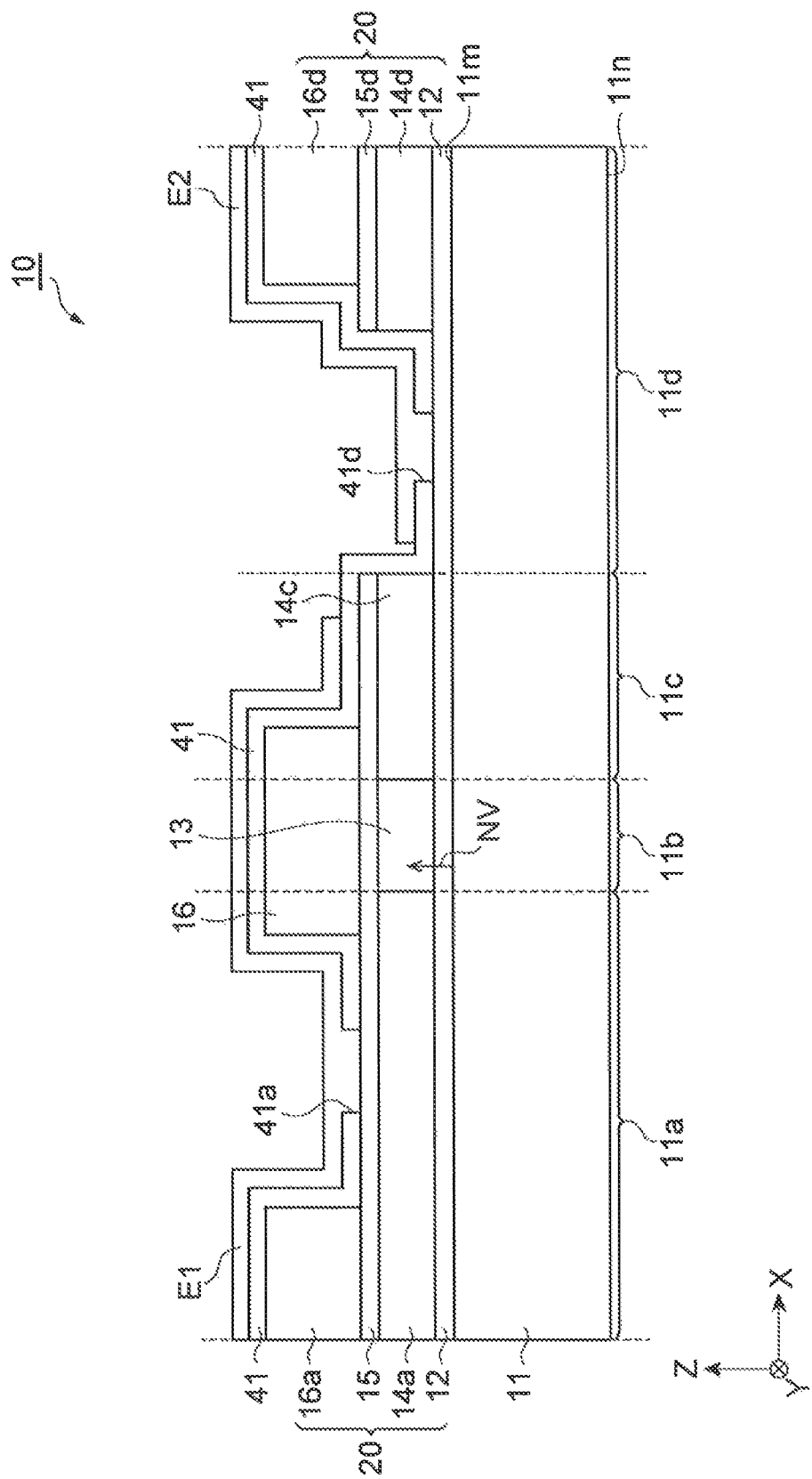
FIG. 9 is a diagram schematically showing the structure of a QCL according to a third embodiment.

FIG. 9 is a diagram schematically showing the structure of a QCL 10 according to a third embodiment. As shown in FIG. 9, the QCL 10 according to the third embodiment is different from the QCL 10 according to the first embodiment in the shape of a stacked semiconductor layer 20. That is, the QCL 10 according to the third embodiment includes a cladding layer 16a disposed above the first region 11a of the substrate 11, a buried layer 14d disposed above the fourth region 11d of the substrate 11, an upper conductive layer 15d disposed on the buried layer 14d, and a cladding layer 16d disposed on the upper conductive layer 15d. The cladding layer 16a and the cladding layer 16 are oppositely disposed with an opening portion 41a therebetween. The buried layer 14d and the buried layer 14c are oppositely disposed with an opening portion 41d therebetween. The upper electrode E1 is disposed extending on the cladding layer 16a, and the lower electrode E2 is disposed extending on the cladding layer 16d.

The QCL 10 according to the third embodiment exerts the same effects as those of the QCL 10 according to the first embodiment. In the QCL 10 according to the third embodiment, the height of the stacked semiconductor layer 20 on the first region 11a of the substrate 11 and the height of the stacked semiconductor layer 20 on the fourth region 11d of the substrate 11 are nearly equal to the height of the stacked semiconductor layer 20 on the second region 11b of the substrate 11. When the QCL 10 according to the third embodiment is mounted in the epi-down arrangement, the QCL 10 is supported by the stacked semiconductor layer 20 on the first region 11a, the stacked semiconductor layer 20 on the second region 11b, and the stacked semiconductor layer 20 on the fourth region 11d. Consequently, loads are applied to the stacked semiconductor layer 20 on the first region 11a, the stacked semiconductor layer 20 on the second region 11b, and the stacked semiconductor layer 20 on the fourth region 11d, and the pressure is dispersed. As a result, a physical damage to the mesa waveguide region is reduced, so that degradation in the device characteristics is suppressed even when the QCL is mounted on a sub-mount (heat sink) or a package in the epi-down arrangement. In the epi-down mounting, when the QCL 10 is die-bonded on the heat sink, a solder material disposed on the heat sink and the electrode of the QCL 10 are reacted to form an alloy. In this manner, the QCL 10 is mounted on the heat sink. Therefore, in the structure shown in FIG. 9, the upper electrode E1 or lower electrode E2 is formed on each surface of the stacked semiconductor layer 20 on the first region 11a, the stacked semiconductor layer 20 on the second region 11b, and the stacked semiconductor layer 20 on the fourth region 11d, which are in contact with the solder material.

The QCL according to the present invention is not limited to the above-described embodiments. For example, the QCL 10 may include a lower optical confinement layer and an upper optical confinement layer disposed adjoining the core layer 13 in order to confine the guided light in the core layer 13. The lower optical confinement layer is disposed between the core layer 13 and the lower conductive layer 12. The upper optical confinement layer is disposed between the core layer 13 and the upper conductive layer 15. Preferably, the optical confinement layer is made of a material having a high refractive index. The optical confinement layer is made of, for example, n-type GaInAs which is lattice-matched to the InP substrate.

The QCL 10 may include a contact layer in order to obtain a good ohmic contact with a low contact resistance between the electrode and the semiconductor layer. The contact layer may be disposed at least one of between the upper electrode E1 and the upper conductive layer 15 and between the lower electrode E2 and the lower conductive layer 12. Preferably, the contact layer has a low bandgap energy and, in addition, is made of a lattice-matched semiconductor to the InP substrate, for example, n-type GaInAs.

The QCL 10 may include a lower cladding layer. The lower cladding layer is disposed between the substrate 11 and the lower conductive layer 12. The lower cladding layer is disposed when, for example, the substrate 11 is not used as the lower cladding layer. The lower cladding layer is made of, for example, semi-insulating InP or undoped InP.

While the embodiments and the examples of the present invention have been described, the disclosed embodiments and examples of the present invention are intended to illustrate and not limit the scope of the invention. The scope of the present invention is defined by the Claims. All changes which fall within meanings and scopes equivalent to the Claims are included.

What is claimed is:

1. A quantum cascade laser comprising:
   a substrate having a principal surface, the substrate having a first region, a second region, a third region, and a fourth region which are arranged sequentially along a first direction orthogonal to an axis of the normal to the principal surface;
   a stacked semiconductor layer disposed on the principal surface of the substrate, the stacked semiconductor layer including an n-type lower conductive layer, a core layer, an n-type, upper conductive layer, and a cladding layer;
   a first mesa structure including the core layer;
   a first buried layer disposed on one side surface of the first mesa structure;
   a second buried layer disposed on the other side surface of the first mesa structure;
   a second mesa structure including the cladding layer, the second mesa structure being disposed on the upper conductive layer over the first mesa structure and over a portion of the first buried layer or a portion of the second buried layer;
   an insulating layer disposed on a side surface of the second mesa structure and a top surface of the second mesa structure and on a surface of the upper conductive layer in the first region, the insulating layer having a first opening portion in the first region;
   a first electrode disposed on the insulating layer, the first electrode extending from the first region to the third region, the first electrode being in contact with the upper conductive layer through the first opening portion; and
   a second electrode disposed on the lower conductive layer in the fourth region, wherein
   the lower conductive layer is disposed on the first region, the second region, the third region, and the fourth region of the substrate,
   the first buried layer, the first mesa structure, and the second buried layer are arranged on a surface of the lower conductive layer in the first region, the second region, and the third region respectively in the first direction,
   the upper conductive layer is disposed on the first and second buried layers, and on the first mesa structure,
   the substrate and the cladding layer are formed of an undoped or semi-insulating semiconductor,
   the first buried layer and the second buried layer are formed of a semi-insulating semiconductor, and
   the second mesa structure has a width larger than a width of the first mesa structure along the first direction.

2. The quantum cascade laser according to the claim 1, wherein
   the insulating layer is further disposed on a surface of the lower conductive layer in the fourth region,
   the insulating layer has a second opening portion in the fourth region, and
   the second electrode is in contact with the lower conductive layer through the second opening portion.

3. The quantum cascade laser according to claim 2, wherein the insulating layer is made of any one of silicon oxides, silicon nitrides, silicon oxynitrides, and aluminum oxides.

4. The quantum cascade laser according to claim 1, wherein
   the stacked semiconductor layer on the first region includes the n-type lower conductive layer, the first buried layer, the n-type upper conductive layer, and the cladding layer,
   the stacked semiconductor layer on the fourth region includes the n-type lower conductive layer, the second buried layer, the n-type upper conductive layer, and the cladding layer, and
   the stacked semiconductor layers on the first region and the fourth region have a height substantially equal to a height of the stacked semiconductor layer on the second region.

5. The quantum cascade laser according to claim 1, wherein the cladding layer is formed of a semiconductor containing any one of transition metals Fe, Ti, Cr, and Co.

6. The quantum cascade laser according to claim 1, wherein the first buried layer and the second buried layer are made of InP containing any one of transition metals Fe, Ti, Cr, and Co, or AlInAs containing the any one transition metal.

7. The quantum cascade laser according to claim 1, wherein the lower conductive layer, the upper conductive layer, and the cladding layer are made of InP.

8. The quantum cascade laser according to claim 1, wherein
   the core layer includes a plurality of light-emitting layers serving as light-emitting regions and a plurality of injection layers to inject carriers into the light-emitting layers, and
   the light-emitting layers and the injection layers are arranged alternately.

9. The quantum cascade laser according to claim 8, wherein each of the light emitting layers and the injection layers is configured to have a super-lattice structure of GaInAs and AlInAs.

10. The quantum cascade laser according to claim wherein the substrate is made of InP.

11. The quantum cascade laser according to claim 1, wherein the cladding layer extends over the second region to over a portion of the first region or the third region.

12. The quantum cascade laser according to claim 11, wherein the cladding layer extends over a portion of both of the first region and the third region.

13. A quantum cascade laser comprising;
a substrate having a principal surface;
a stacked semiconductor layer disposed on the principal surface of the substrate, the stacked semiconductor layer including an n-type lower conductive layer, a core layer, an n-type upper conductive layer, and a cladding layer;
a first buried layer disposed on one side surface of the core layer;
a second buried layer disposed on the other side surface of the core layer so as to provide a first mesa structure including the core layer;
a first electrode disposed on the upper conductive layer; and
a second electrode disposed on the lower conductive layer, wherein
the first mesa structure has a width in a direction orthogonal to an axis of the normal to the principal surface, and the first mesa structure width defines a second region of the substrate that has a width in said direction that is substantially the same as the first mesa structure width,
the first buried layer and the second buried layer respectively define a first region of the substrate and a third region of the substrate that each end at the second region of the substrate,
the first region, the second region, and the third region of the substrate are arranged sequentially along said direction, and the substrate further has a fourth region at the end of the third region on a side of the second buried layer opposite the core layer,
the second electrode is above the fourth region,
the lower conductive layer is disposed on the second region, the third region, and the fourth region,
the core layer is disposed on the lower conductive layer above the second region,
the upper conductive layer is disposed on the first buried layer and on the core layer,
the cladding layer provides a second mesa structure that is disposed on the upper conductive layer above the entirety of the second region and that extends from above the second region to above a portion of the first region or the third region,
an insulating layer is provided on a side surface and a top surface of the second mesa structure, and on a surface of the upper conductive layer over the first region, the insulating layer having a first opening portion over the first region,
the first electrode is above the first region and extends therefrom to over the third region, the first electrode being in contact with the upper conductive layer through the first opening portion in the insulating layer,
the substrate and the cladding layer are formed of an undoped or semi-insulating semiconductor, and
the first buried layer and the second buried layer are formed of a semi-insulating semiconductor.

14. The quantum cascade laser according to claim 13, wherein
the lower conductive layer extends over the entirety of the second region, the third region, and the fourth region,
the upper conductive layer extends over the entirety of the first buried layer and the core layer, and
the cladding layer extends over the entirety of the second region.

15. The quantum cascade laser according to claim 14, wherein
the cladding layer extends to above a portion of both of the first region and the third region, and
the first electrode extends over the second region and the third region.

16. The quantum cascade laser according to the claim 13, wherein
the insulating layer is made of any one of silicon oxides, silicon nitrides, silicon oxynitrides, and aluminum oxides,
the insulating layer has a second opening portion disposed above the fourth region, and
the second electrode is in contact with the lower conductive layer through the second opening portion.

17. The quantum cascade laser according to claim 13, wherein
the stacked semiconductor layer on the first region includes the n-type lower conductive layer, the first buried layer, the n-type upper conductive layer, and the cladding layer,
the stacked semiconductor layer on the fourth region includes the n-type lower conductive layer, the second buried layer, the n-type upper conductive layer, and the cladding layer, and
the stacked semiconductor layers on the first region and the fourth region have a height substantially equal to a height of the stacked semiconductor layer on the second region.

18. The quantum cascade laser according to claim 13, wherein
the cladding layer is formed of a semiconductor containing any one of transition metals Fe, Ti, Cr, and Co,
the first buried layer and the second buried layer are made of InP containing any one of transition metals Fe, Ti, Cr, and Co, or AlInAs containing the any one transition metal,
the lower conductive layer, the upper conductive layer, and the cladding layer are made of InP, and
the substrate is made of InP.

19. The quantum cascade laser according to claim 13, wherein
the core layer includes a plurality of light-emitting layers serving as light-emitting regions and a plurality of injection layers to inject carriers into the light-emitting layers,
the light-emitting layers and the injection layers are arranged alternately, and
each of the light emitting layers and the injection layers is configured to have superlattice structure of GaInAs and AlInAs.

* * * * *

UNITED STATES PATENT AND TRADEMARK OFFICE
CERTIFICATE OF CORRECTION

PATENT NO. : 9,356,429 B2
APPLICATION NO. : 14/194054
DATED : May 31, 2016
INVENTOR(S) : Jun-ichi Hashimoto It is certified that error appears in the above-identified patent and that said Letters Patent is hereby corrected as shown below:

In the claims,

In claim 10, at column 18, line 63, "claim wherein" should read -- claim 1, wherein --.

Signed and Sealed this
Ninth Day of August, 2016

Michelle K. Lee
*Director of the United States Patent and Trademark Office*